United States Patent
Neufeld et al.

(10) Patent No.: US 7,456,379 B2
(45) Date of Patent: *Nov. 25, 2008

(54) PRINTING PLATE REGISTRATION AND OPTICAL ALIGNMENT DEVICE INCLUDING LOCATING AT LEAST A PART OF A REFERENCE EDGE IN AT LEAST ONE DIGITAL CAMERA IMAGE

(75) Inventors: Richard Neufeld, Burnaby (CA); Calvin D. Cummings, Surrey (CA); Allan Warnes, North Vancouver (CA)

(73) Assignee: Kodak Graphic Communications Canada Company, Burnaby, British Columbia (CA)

( * ) Notice: Subject to any disclaimer, the term of this patent is extended or adjusted under 35 U.S.C. 154(b) by 606 days.

This patent is subject to a terminal disclaimer.

(21) Appl. No.: 11/204,223

(22) Filed: Aug. 16, 2005

(65) Prior Publication Data
US 2006/0005728 A1    Jan. 12, 2006

Related U.S. Application Data

(63) Continuation-in-part of application No. 10/356,574, filed on Feb. 3, 2003, now Pat. No. 6,968,782.

(51) Int. Cl.
*H01L 27/00* (2006.01)
(52) U.S. Cl. .................. 250/208.1; 250/559.3
(58) Field of Classification Search ..............
250/559.04–559.08, 559.12–559.15, 559.29,
250/559.3, 559.36, 599.37; 347/19, 262,
347/264, 233, 239, 187, 175; 356/399–400;
101/484–486; 355/47–55; 358/1.9, 1.15
See application file for complete search history.

(56) References Cited

U.S. PATENT DOCUMENTS

| 4,876,456 | A | 10/1989 | Isono et al. |
| 4,881,086 | A | 11/1989 | Misawa |
| 5,214,294 | A | 5/1993 | Toyofuku |
| 5,479,859 | A | 1/1996 | Lindner et al. |
| 5,488,781 | A | 2/1996 | Van Der Horst |
| 5,666,881 | A | 9/1997 | Zanoli |
| 5,850,789 | A | 12/1998 | Rudolf et al. |
| 5,992,325 | A | 11/1999 | Schumann et al. |
| 6,016,752 | A | 1/2000 | Harari |
| 6,137,989 | A | 10/2000 | Quesnel |
| 6,247,404 | B1 | 6/2001 | Okamura |
| 6,305,856 | B1 | 10/2001 | Miyazaki |
| 6,318,262 | B1 | 11/2001 | Wolber et al. |

(Continued)

FOREIGN PATENT DOCUMENTS

EP    1 081 458 A1    8/2000

(Continued)

*Primary Examiner*—Que T Le
(74) *Attorney, Agent, or Firm*—Donna P. Sachy

(57) ABSTRACT

A method and apparatus for determining the alignment of printing plate mounted on an imaging drum, and applying an image to a printing plate while maintaining registration and alignment between the image and a reference edge of the printing plate include mounting the printing plate on a plate making machine and then determining the locations of at least one point on the reference edge. The locations of two or more points are used to determine a transformation that is applied to image data to yield transformed image data. The transformed image data is used to image the printing plate.

35 Claims, 10 Drawing Sheets

U.S. PATENT DOCUMENTS

| | | |
|---|---|---|
| 6,321,651 B1 | 11/2001 | Tice et al. |
| 6,510,793 B1 | 1/2003 | Kerr et al. |
| 6,568,777 B1 | 5/2003 | Anderson et al. |
| 6,755,132 B1 | 6/2004 | Cummings |
| 6,772,691 B2 | 8/2004 | Wolber |
| 6,815,702 B2 | 11/2004 | Kiermeier et al. |
| 6,845,288 B2 | 1/2005 | Pierel et al. |
| 6,915,743 B2 | 7/2005 | Blohdorn et al. |
| 7,063,018 B2 * | 6/2006 | Smythies et al. ............ 101/486 |
| 2002/0181021 A1 | 12/2002 | Stephens |
| 2003/0209680 A1 | 11/2003 | Burkatovsky |
| 2004/0139403 A1 | 7/2004 | Yakuhov et al. |
| 2004/0159780 A1 | 8/2004 | Fischer et al. |
| 2004/0178570 A1 | 9/2004 | Biohdorn et al. |
| 2004/0231543 A1 | 11/2004 | Smythies et al. |
| 2005/0062780 A1 | 3/2005 | Chee |
| 2005/0120899 A1 | 6/2005 | Gelbart et al. |
| 2005/0155419 A1 | 7/2005 | Naruoka |
| 2006/0005728 A1 | 1/2006 | Neufield et al. |

FOREIGN PATENT DOCUMENTS

| | | |
|---|---|---|
| EP | 1081458 A2 | 3/2001 |
| JP | 3722330 B2 * | 9/2005 |

* cited by examiner

PRINTING PLATE REGISTRATION AND OPTICAL ALIGNMENT DEVICE INCLUDING LOCATING AT LEAST A PART OF A REFERENCE EDGE IN AT LEAST ONE DIGITAL CAMERA IMAGE

RELATED APPLICATIONS

This application is a continuation-in part of U.S. patent application Ser. No. 10/356,574, filed Feb. 3, 2003 and published Jun. 2, 2005 under U.S. publication US20050115430A1.

TECHNICAL FIELD

The invention relates to printing and, in particular to providing registered images on printing plates.

BACKGROUND

Printing plates may be imaged on a plate-making machine and then transferred to a printing press. Once on the printing press, the images from the printing plates are transferred to paper or other suitable substrates. It is important that images printed using a printing press be properly aligned with the substrate on which they are printed. Obtaining such alignment typically involves:
   carefully aligning a reference edge of a printing plate with pins or other features on the plate making machine;
   detecting one reference point on an orthogonal edge of the printing plate (i.e. orthogonal to the reference edge) at a known distance from the reference pins;
   imaging the printing plate; and,
   using the reference edge and the orthogonal edge reference point to align the printing plate on a drum of the printing press.
   One common technique of aligning the printing plate on the drum of a printing press involves using the reference edge and the orthogonal edge reference point to align the printing plate on a punching machine and punching registration holes in the printing plate. The printing plate may then be aligned on the drum of the printing press with registration pins that project through the registration holes.

Techniques for detecting an edge of a printing plate, and any associated skew in the plate are disclosed in U.S. Pat. No. 6,321,651 by Tice et al. and in U.S. Pat. No. 6,318,262 by Wolber et al. In these patents edge detection sensors are employed in the load path to an imaging drum upon which a printing plate is imaged. U.S. Pat No. 4,881,086 to Misawa describes a laser recorder with sheet edge detection. The edge detection works on the principle of the difference in reflectivity between of the sheet and the drum on which it is carried.

European Patent Application EP 1 081 458 A2 to Elior et al. describes an apparatus for detecting a plate edge including an optical print-head for illuminating a plate system with a light beam having a focal point generally at the plate, a detector for measuring the intensity of the light reflected from the plate system, and means for altering the relative position of the edge of the plate and the light beam. Elior et al. also teach the use of this apparatus to determine a skew angle of the plate mounted on a plate support surface.

U.S. Pat. No. 6,815,702 to Kiermeier et al. describe detecting the edge of a printing plate mounted on an external drum by using a light source and light sensor to measure the difference in reflectivity between the plate and drum surface. Two grooves formed in the drum surface are used to increase the difference in reflectivity between the plate and the drum. A difference in the positions where the plate covers each of the grooves is determined and compared against predetermined value to determine if a skewed plate is mounted on the drum.

U.S. Pat. No. 4,876,456 to Isono et al. describe using photosensors having light emitting elements and light receiving elements disposed in a path for carrying a photosensitive film. The light emitting elements emit periodic pulsed light. When the film is present at the locations of the photosensors, the periodic pulsed light is reflected by the film to enter the light receiving elements thereby detecting the presence of the film. The activation time and activation interval of the light emitting elements are determined so that accumulated exposure value in each portion on the film is less than an upper limit value of accumulated exposure value of the photosensitive film.

Printing plates are typically rectangular in shape. One of the long edges of the printing plate may be typically used as a reference edge.

In the printing industry there is a general need for ways to improve the speed and accuracy with which printing plates can be prepared.

SUMMARY OF THE INVENTION

This invention provides a method and apparatus for determining an alignment of a printing plate and imaging the printing plate in accordance with the determined alignment. The present invention comprises mounting the printing plate on an imaging support surface of a plate making machine and subsequently determining locations of at least one point on a reference edge of the printing plate relative to the surface. Based on the determined locations of the each point on the reference edge, the method involves adjusting print image data such that a print image corresponding to a print image data is imparted on the printing plate in alignment with at least the determined locations of each point. An illumination source may be used to illuminate a region associated with each point, the region including at least a part of the reference edge. A digital camera may be used to take digital camera images of each region. The location of each point is determined at least in part by locating the at least a part of the reference edge in each digital camera image. When the at least one point includes at least two circumferentially spaced apart points, a transformation required to impart the print image on the printing plate in a desired registration relative to the reference edge is determined. The transformation may include a rotation. The method also involves applying the transformation to digital image data to yield transformed image data and using the transformed image data to image the printing plate.

The invention makes it unnecessary to accurately align the printing plate on the plate-making machine prior to imaging the printing plate.

A first aspect of the invention provides a method of imparting a print image on a printing plate. The method includes mounting the printing plate on an imaging drum in an orientation in which a reference edge of the printing plate extends around the drum in a substantially circumferential direction. A location of each of at least one point on the reference edge is determined. Determining the location of each point includes illuminating a region, the region including at least a part of the reference edge associated with each of the points. Determining each location also includes capturing at least one digital camera image of each region, and locating the at least a part of the reference edge in the digital camera image.

The method includes imparting the print image on the printing plate in alignment with at least the determined location of the at least one point.

The at least one point may include at least two circumferentially spaced apart points on the reference edge. The method may further include transforming print image data representing the print image in accordance with the determined locations of the at least two circumferentially spaced apart points, to yield transformed print image data. The print image may be imparted on the printing plate using the transformed print image data, the imparted print image being aligned with the reference edge.

An illumination source may be used for illuminating each region and a digital camera may be used to capture the digital camera images. One or both of the illumination source and the digital camera may be moved in an axial direction relative to the imaging drum. The method may further provide for flashing the illumination source during the illuminating. Flashing the illumination source may include emitting a pulse of light with a pulse width less than 20 μs.

The imaging drum may rotate during the flashing of the illumination source. Rotating the imaging drum may include accelerating or decelerating the imaging drum. The imaging drum may also be rotated at the constant rotational speed. Flashing the illumination source may include flashing the illumination source when each point rotates to a predetermined rotational position relative to the illumination source. The method may also provide for continuously capturing a sequence of digital camera images as the imaging drum is rotated.

Illuminating the region may include forming a shadow in the region, the shadow being formed at the at least a part of the reference edge. The method may also provide for capturing a first digital camera image of the region. A shadow may be formed in the region at the at least a part of the reference edge and a second digital camera image of the region including the shadow may be captured. The at least a part of the reference edge may be located in the region by comparing the first and second digital camera images.

Determining the location of the at least one point may include determining a rotational position of the imaging drum at each point. Determining the location of the at least one point may include determining an axial position of the digital camera relative to the drum when the digital camera is axially movable.

The at least one digital camera image may be captured by a digital camera operating in either a field integration mode, or a frame integration mode. The at least one digital camera image may be captured in at least one of an ODD and EVEN field of a first video frame captured by the digital camera. The at least one digital camera image may be captured in at least one of the ODD and EVEN fields of the first video frame and at least one of an ODD and EVEN field of a second video frame captured by the digital camera.

The method may further provide for emitting a flashed pulse of light during the illuminating of the region and the at least one digital camera image may include an image illuminated by the flashed pulse of light. The image of the flashed pulse of light may be captured in one or more video frames of a plurality of video frames captured by the digital camera, and the method may further include distinguishing the one or more video frames from the rest of the plurality of video frames by comparing a brightness level of a given pixel image in each of the plurality of video frames. The one or more video frames may also be distinguished from the rest of the plurality of video frames by comparing the same field of each of the plurality of video frames.

Locating the at least part of the reference edge in the digital camera image may include applying a correlation algorithm to distinguish an image of the at least a part of the reference edge from a prototype edge. Applying a correlation algorithm may include applying a Haar transform. Applying a correlation algorithm may also include applying a coiflet transform. Locating the at least a part of the reference edge in the digital camera image may include performing a line detection algorithm. The printing plate may be substantially rectangular in shape, and include a pair of longer edges and a pair of shorter edges. The reference edge may be one of the longer edges.

In another aspect of the invention, a method is provided for determining an alignment of a printing plate relative to an imaging drum on which the printing plate is mounted. The method includes determining a location of at least one point on a reference edge of the printing plate. The reference edge extends around the imaging drum in a substantially circumferential direction. Determining the location of each point includes illuminating a region including at least a part of the reference edge associated with each point. Determining the location of each point includes capturing at least one digital camera image of the region with a digital camera and locating the at least a part of the reference edge in the digital camera image. The method provides for determining the alignment of the printing plate at least in part from the location of the at least a part of the reference edge in the digital camera image of each point, and a position of the digital camera relative to the imaging drum during the capturing of the at least one digital camera image of each point.

The at least one point may include at least two circumferentially spaced apart points on the reference edge. The imaging drum may include at least one registration pin in contact with an edge of the printing plate. The alignment of the printing plate may further be determined from a position of at least one registration pin. The digital camera may be mounted on a carriage operable for moving in an axial direction relative to the imaging drum. The alignment of the printing plate may further be determined from an axial position of the carriage.

Yet another aspect of the invention provides an apparatus for imparting a print image on a printing plate. The apparatus includes a substantially cylindrical imaging drum. The imaging drum includes means for securing the printing plate in an orientation in which a reference edge of the printing plate extends around the imaging drum in a substantially circumferential direction. The apparatus includes an illumination source operable for illuminating a region associated with each of at least one point on the reference edge. Each of the regions includes at least a part of the reference edge. The apparatus includes a digital camera operable for capturing a digital camera image of each region. The apparatus also includes one or more processors operable for determining a location of each point by at least locating the at least a part of the reference edge in each digital camera image. The one or more processors are further operable for adjusting print image data representing the print image in accordance with the determined locations of each point, the adjusted print image data including data to align the print image with at least the determined location of each point. The apparatus also includes an imaging head operable for receiving the adjusted print image data from the one or more processors and for imparting the print image onto the printing plate in accordance with the adjusted print image data.

The at least one point may include at least two circumferentially spaced apart points on the reference edge. The one or more processors may be further operable for transforming the print image data into transformed print image data based on the determined locations of each of the at least two circumferentially spaced apart points. The transformed print image data includes data to align the print image with the reference edge. The image head may be further operable for imparting the print image on the printing plate in accordance with the transformed print image data, the imparted print image being aligned with the reference edge.

The apparatus may include a movable carriage operable for moving the imaging head in an axial direction relative to the imaging drum. The carriage may be further operable for moving at least one of digital camera and the illumination source in the axial direction. The imaging drum may rotate during the illumination of each region and/or the capturing of digital camera images of each region. The digital camera may include one of a CCD sensor and a CMOS sensor. The illumination source may be a LED. The apparatus may further include a controller operable for flashing the illumination source during the illumination of each region associated with each of the at the at least two circumferentially spaced apart points.

In addition to the exemplary aspects and embodiments described above, further aspects and embodiments will become apparent by reference to the drawings and by study of the following detailed descriptions.

BRIEF DESCRIPTION OF THE DRAWINGS

In drawings which illustrate non-limiting embodiments of the invention.

DESCRIPTION

Throughout the following description, specific details are set forth in order to provide a more thorough understanding of the invention. However, the invention may be practiced without these particulars. In other instances, well known elements have not been shown or described in detail to avoid unnecessarily obscuring the invention. Accordingly, the specification and drawings are to be regarded in an illustrative, rather than a restrictive, sense.

Prior Art

Figure 1:
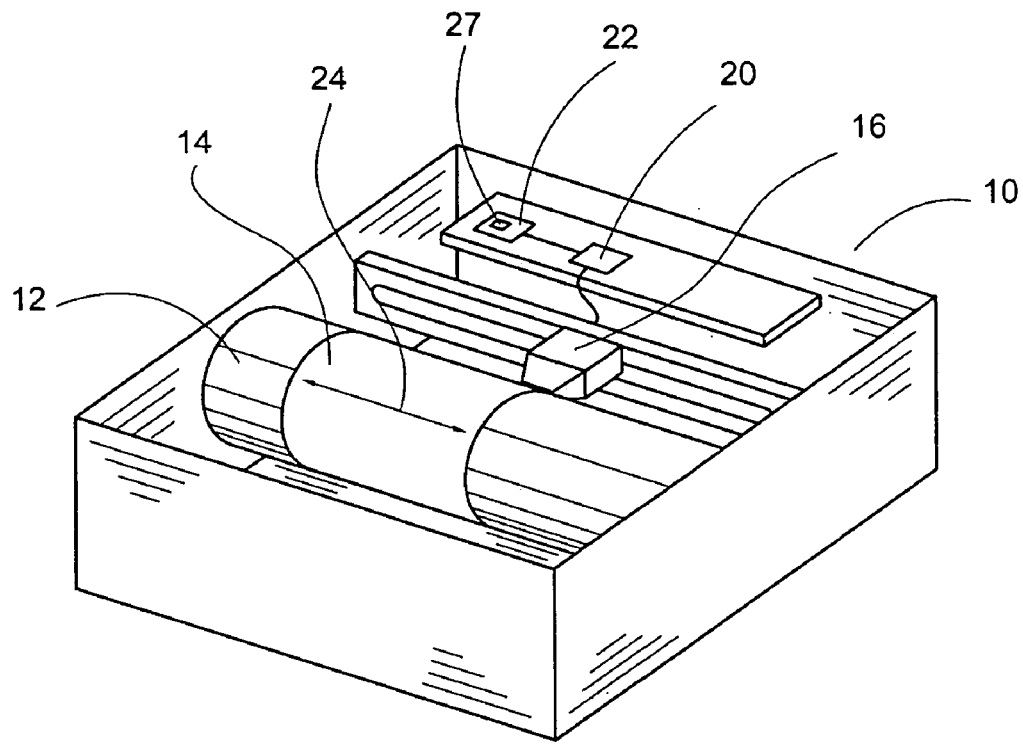
FIG. 1 is a schematic diagram of a prior art external drum-type plate-making machine.

FIG. 1 is a schematic depiction of a plate-making machine 10 having a drum 12 on which a printing plate 14 may be mounted. Plate-making machine 10 has an imaging head 16 which can impart an image onto printing plate 14. In the illustrated embodiment, imaging head 16 is axially movable relative to drum 12 (i.e. along the directions parallel to the axis of drum 12 indicated by double-headed arrow 24). Imaging head 16 typically includes a radiation source (not shown), such as a laser, which emits one or more beams of laser radiation capable of imparting an image onto printing plate 14. A controller 20 controls imaging head 16 and its associated radiation source in accordance with print image data stored in a memory 22, so as to image printing plate 14. The Trendsetter™ plate-setters available from Creo Inc. of Burnaby, British Columbia, Canada represent examples of plate making machines having the basic configuration shown in FIG. 1.

Figure 2A:
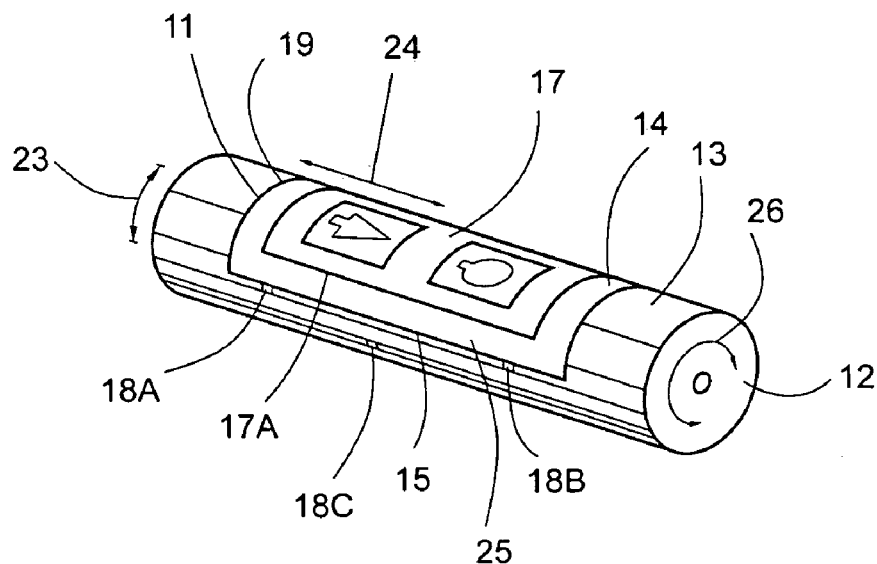
FIG. 2A is an isometric depiction of a printing plate mounted to a drum in the plate-making machine of FIG. 1.

FIG. 2A shows drum 12 of plate-making machine 10 in greater detail. Drum 12 has a plurality of registration pins 18, which project from its cylindrical surface 13. In the illustrated embodiment, drum 12 comprises three registration pins 18A, 18B, 18C, which may be offset slightly from one another around the circumference of drum 12 to enable imaging of different sizes of printing plates. A reference edge 15 of plate 14 is brought into engagement with two registration pins 18A, 18B. Typically, plate 14 is rectangular in shape and reference edge 15 may be one of the long edges of plate 14 (as depicted in FIG. 2A). The shorter, orthogonal edge 19 of plate 14 extends around the circumference of drum 12. An edge detector (not shown) detects the position of a third reference point 11 on orthogonal edge 19 of plate 14. Orthogonal edge reference point 11 is located at a fixed circumferential distance 23 relative to registration pins 18. Printing plate 14 is clamped onto drum 12 using any suitable clamping system (not shown). Typically, clamping systems clamp to reference edge 15 and to an opposing edge of plate 14 (not shown) that is parallel to reference edge 15.

With printing plate 14 clamped and registered, drum 12 is rotated about its axis in either or both of the main-scan directions indicated by arrow 26, while imaging head 16 is scanned axially along drum 12 (i.e. in the directions indicated by arrow 24). Controller 20 controls the relative movement of imaging head 16 and drum 12 and controls the radiation source in imaging head 16 in accordance with print image data 27 to impart an print image 17 onto printing plate 14. An edge 17A of print image 17 is created substantially parallel to reference edge 15. The region 25 of plate 14 that is adjacent to reference edge 15 and the region (not shown) that is adjacent to the opposing edge of plate 14 are covered by the clamping system and are not imaged.

Figure 2B:
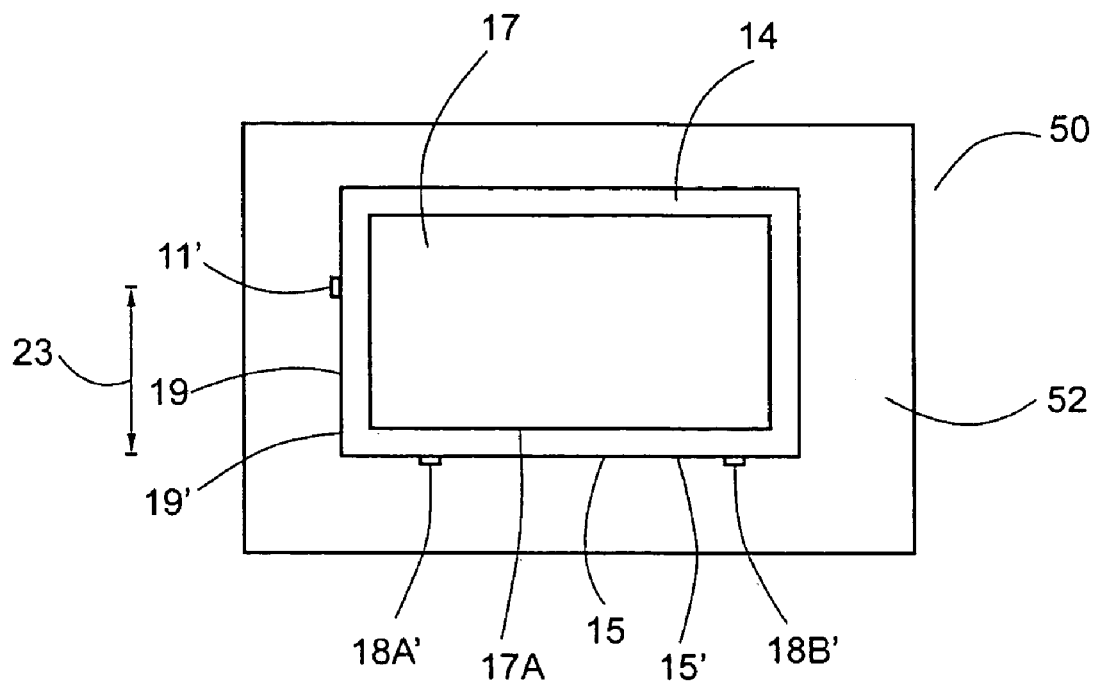
FIG. 2B is a top elevation view of an imaged printing plate in a prior art punching machine.

After being imaged on plate-making machine 10, plate 14 may be punched in a punching machine 50 as shown in FIG. 2B. Plate 14 is registered on punch table 52 of punching machine 50 by bringing it into engagement with two registration surfaces 18A', 18B' on its reference edge 15 and registration surface 11' on its orthogonal edge 19. The position and orientation of the two registration surfaces 18A', 18B' on punch table 52 (as measured with respect to each other and with respect to plate 14) may be substantially the same as the registration pins 18A and 18B on plate-making machine 10. Punch table 52 comprises a third registration surface 11' that is located a distance 23 from registration pins 18. Thus, registration surface 11' is located in the same position as orthogonal edge reference point 11 on plate-making machine 10 (see FIG. 2A). With plate 14 registered to surfaces 18A', 18B', 11', punching machine 50 creates a number of punched features (not shown) in plate 14. The punched features created by punching machine 50 may have a wide variety of shapes, sizes and orientations. However, because the registration points are the same when plate 14 is imaged (18A, 18B, 11) and when it is punched (18A', 18B', 11'), the locations of the punched features are known precisely with respect to image 17.

Once plate 14 is punched, reference edge 15 and the opposing edge (i.e. parallel to reference edge 15) of plate 14 may be bent (not shown).

Figure 2C:
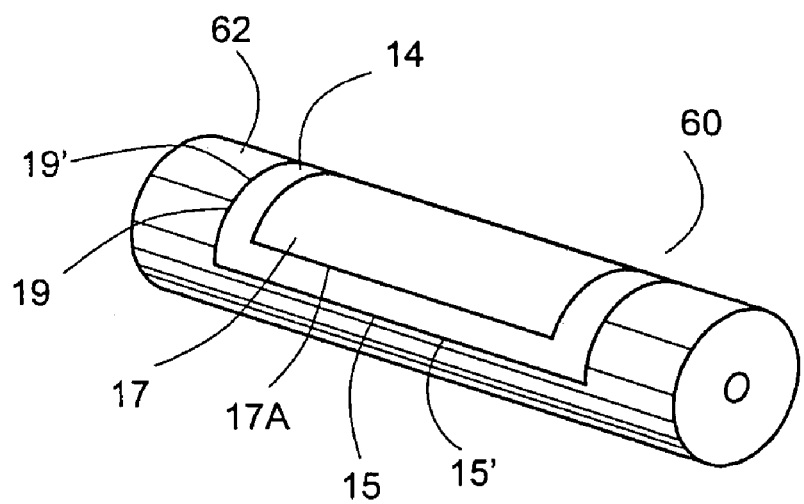
FIG. 2C is an isometric view of an imaged printing plate mounted on the drum of a prior art printing press.

As shown in FIG. 2C, plate 14 is then mounted on a press cylinder 62 of a printing press 60. The clamping system (not shown) of printing press 60, which is used to mount plate 14 to press cylinder 62, may comprise registration pins (not shown) which project through the features punched in plate 14 to secure plate 14 to press cylinder 62. The clamping system may also use the bent edges of plate 14 (if present) to secure plate 14 to press cylinder 62. When plate 14 is securely mounted to press cylinder 62, the clamping system overlaps non-imaged region 25 of plate 14 (i.e. adjacent to reference edge 15) and the non-imaged region adjacent the opposing edge of plate 14 (i.e. the edge parallel to reference edge 15). In this manner, the clamping system of printing press 60 does not impede print image 17 on plate 14. Print image 17 is then transferred to a substrate (not shown) by applying ink to plate 14 and rolling drum 62 to bring inked image 17 into contact with the substrate.

The Present Invention

Figure 3:
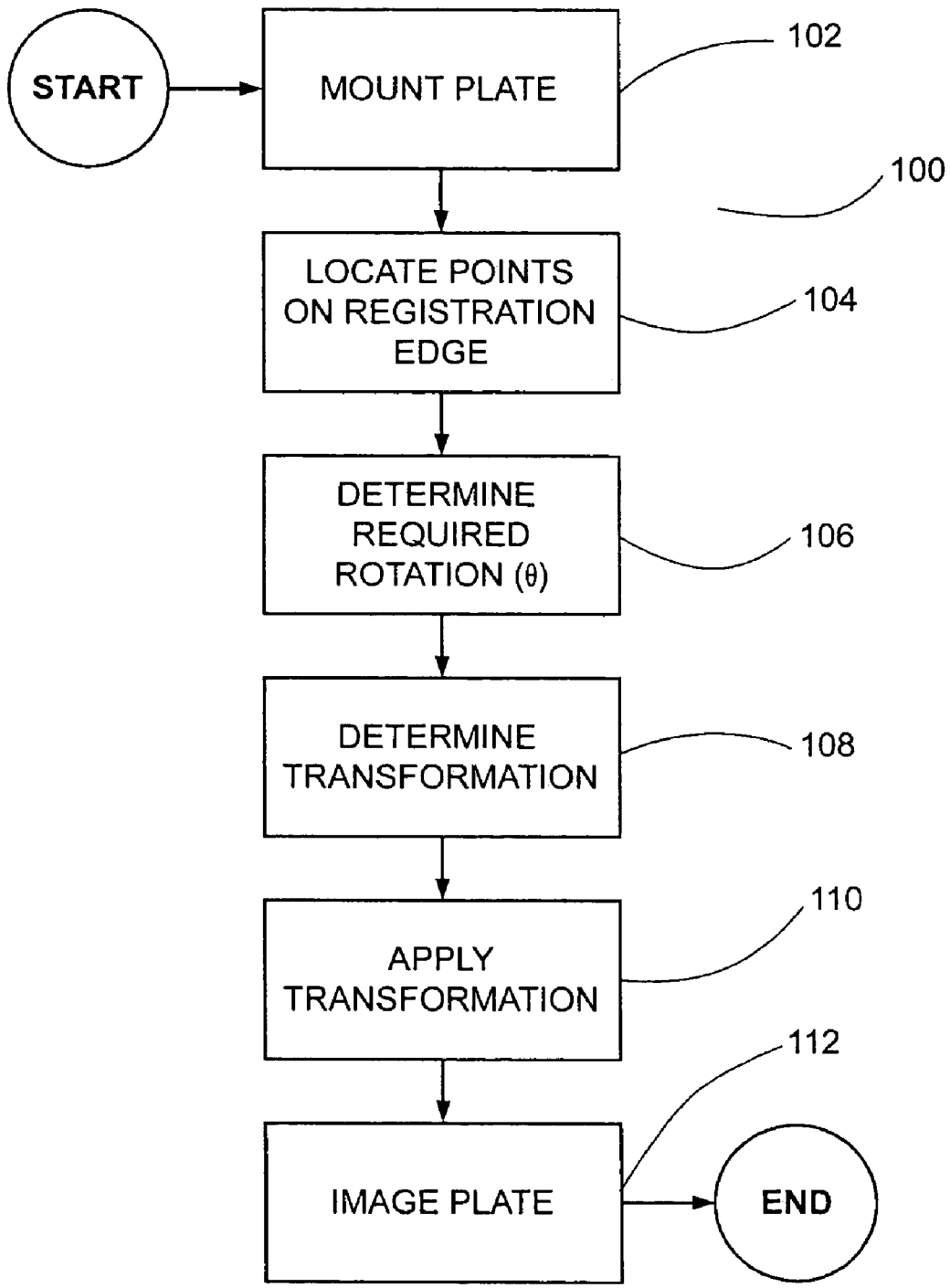
FIG. 3 is flow chart illustrating one embodiment of a method for imaging a printing plate according to the invention.
Figure 4:
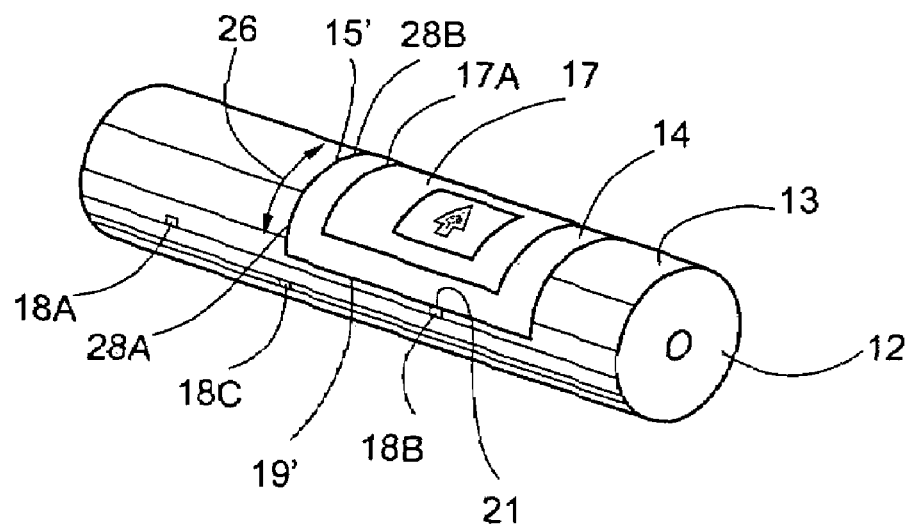
FIG. 4 is an isometric depiction of a printing plate mounted to a drum of a plate-making machine according to a particular embodiment of the invention.

FIG. 3 shows a method 100 for registering and imparting print image 17 onto printing plate 14. FIG. 4 depicts printing plate 14 on drum 12 of a plate-making machine according to one embodiment of the present invention. Method 100 begins with block 102, which involves mounting printing plate 14 on drum 12 of a plate-making machine. The plate-making machine could be an external drum-type plate-making machine 10, as shown in FIG. 1. Alternatively, the plate-making machine could be an internal drum-type plate-making machine.

In the illustrated embodiment of the invention (FIG. 4), printing plate 14 is mounted to a drum 12 of an external drum-type plate making machine with its reference edge 15' (i.e., the longer edge of plate 14 in this preferred embodiment) extending, at least partially, in a circumferential or main-scan direction 26 around drum 12. The shorter, orthogonal edge 19' of plate 14 touches at least one of reference pins 18A, 18B, 18C on drum 12 to provide a single orthogonal edge reference point 21.

A suitable clamping system (not shown) holds printing plate 14 on drum 12 of the plate making machine in a manner that leaves at least a portion of its reference edge 15' exposed. The clamping system may attach itself to orthogonal edge 19' and the opposing edge (i.e. parallel to orthogonal edge 19') of plate 14, leaving a majority of reference edge 15' exposed.

In block 104, the positions of at least two reference points 28A, 28B on reference edge 15' are determined. Reference points 28A, 28B may be found using a suitable edge finder. Various types of edge finder may be used to locate the two or more edge points in block 104. For example, a point on reference edge 15' could be located using an optical reflection-type edge finder, a mechanical probe, a capacitive edge finder, a camera coupled with an image processor executing edge-finding software, a suitable edge finder of any known type, or the like.

Figure 4A:
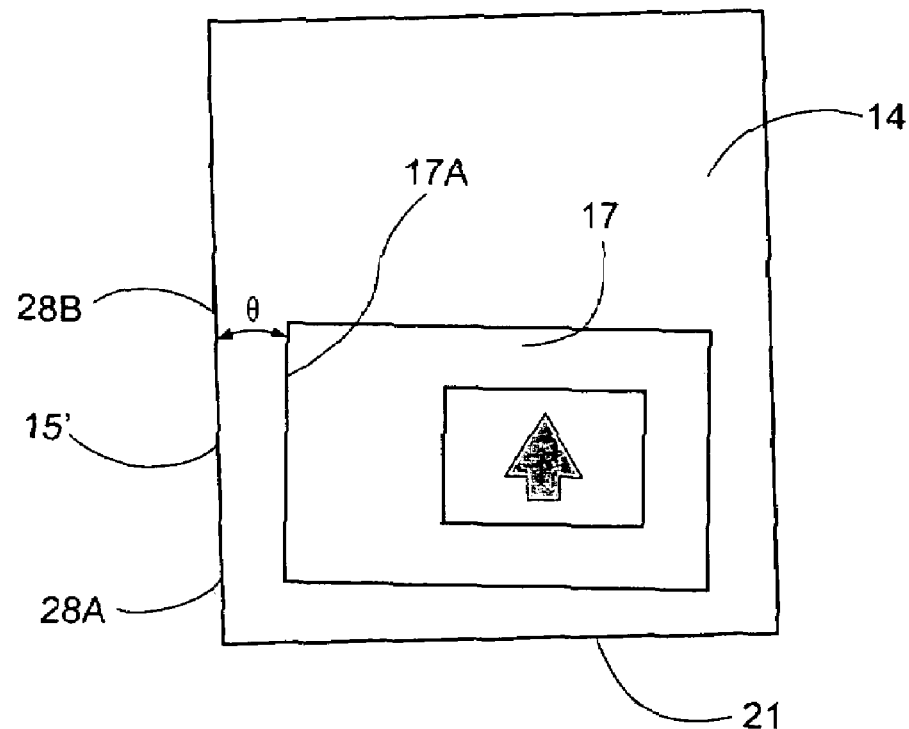
FIG. 4A shows a plan view of an imaged printing plate mounted in a skewed orientation.

FIG. 4A shows a plan view of an imaged printing plate 14 that has been mounted in a skewed orientation with respect to an axis of imaging drum 12. If the skew is not considered, print image 17 may be imparted onto printing plate 14 such that an edge 17A of print image 17 may form an angle θ with respect to reference edge 15'. The amount of skew represented by angle θ has been exaggerated in FIG. 4A for the purposes of clarity and may be less or more than the angle shown. Referring back to FIG. 3, in block 106 the locations of the at least two reference points reference 28A and 28B are used to determine angle θ by which print image 17 should be rotated to properly align an edge 17A of print image 17 with reference edge 15' of printing plate 14. In block 108, the rotation angle θ determined in block 106 is used to generate a transformation to be applied to print image data. The transformation may combine rotation and translation to map each image point in the print image data to a transformed image point.

The transformation is applied to print image data in block 110 to produce transformed image data. The transformation may be determined (in block 108) and applied to print image data (in block 110) by a data processor at the plate-making machine. For example, a processor in controller 20 may determine the transformation from data provided by the edge finder and apply the transformation to print image data.

In block 112, the transformed print image data is used by controller 20 to drive imaging head 16 and its associated radiation source, so that print image 17 is imparted on plate 14. As discussed above, imaging head 16 moves in the axial sub-scan directions (see arrow 24 of FIG. 1) to impart print image 17 onto plate 14 while drum 12 rotates in a main-scan directions (see arrow 26 of FIG. 1). In accordance with an embodiment of the present invention, when plate 14 is oriented on drum 12 with its longer, reference edge 15' extending (at least partially) in circumferential direction 26 and its shorter, orthogonal edge 19' extending (at least partially) parallel to the axis of drum 12, print image 17 may be imparted on plate 14 significantly more quickly than in prior art embodiments, because plate 14 can be completely imaged while moving imaging head 16 through a reduced range of travel in the axial direction. Advantageously, this mounting orientation may further allow for the imaging of multiple plates mounted on drum 12 that would not be possible if the plate or plates were mounted on drum 12 with their longer edges oriented with the axis of drum 12.

Print image 17 imparted onto plate 14 will have an edge 17A that is aligned with reference edge 15' of plate 14. In some embodiments, print image 17 imparted onto plate 14 may have some other desired registration relative to reference edge 15'. This other desired registration may be repeated for other associated plates made in the plate-making machine to assure registration among all the associated plates when mounted on a printing press.

After plate 14 is imaged, it may be punched on a punching machine 50 (see FIG. 2B). Registration surfaces 18A', 18B' of punching machine 50 are typically aligned with edge detected reference points 28A, 28B on reference edge 15' of plate 14.

Similarly, registration surface 11' of punching machine 50 is typically aligned with orthogonal edge reference point 21. Because of the registration of reference points 21, 28A, 28B to registration surfaces 11', 18A', 18B', when plate 14 is punched, the locations of the punched features are known precisely with respect to print image 17. If required, reference edge 15' and the opposing edge (i.e. parallel to reference edge 15') of plate 14 may be bent (not shown).

Plate 14 may then be mounted onto press cylinder 62 of a printing press 60 (see FIG. 2C). When plate 14 is mounted on the press cylinder of a printing press, it is preferably mounted such that its reference edge 15' extends in an axial direction (i.e. parallel to the axis of the press cylinder). The clamping system of printing press 60 may comprise registration pins which project through one or more of the punched features in plate 14 to secure plate 14 to press cylinder 62. The clamping system of press 60 may also use the bent edges of plate 14 to secure it to press cylinder 62. Once mounted to press cylinder 62, print image 17 can be inked and transferred to paper and/or other suitable substrates.

Figure 5:
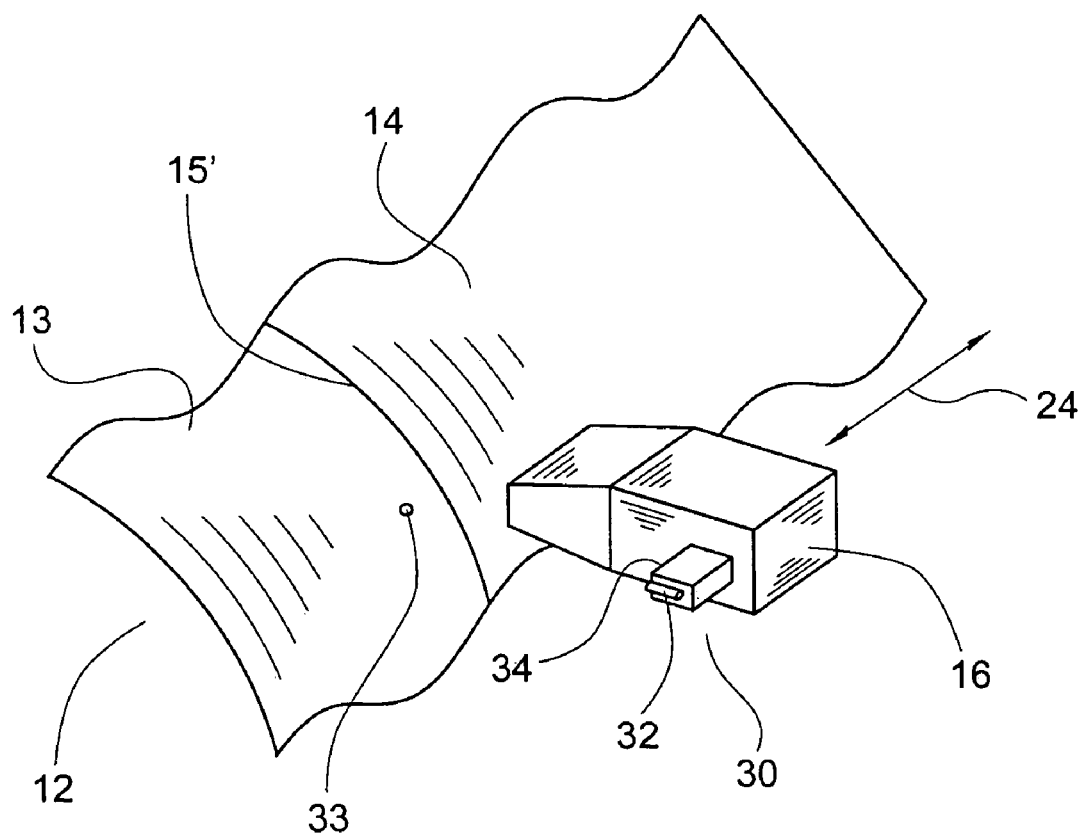
FIG. 5 is a schematic illustration of a plate-making machine according to one embodiment of the invention that comprises a reflection-type edge finder.

FIG. 5 illustrates the operation of a reflection-type edge finder 30 that is mounted on imaging head 16. Edge finder 30 relies upon differences in the reflective properties of printing plate 14 and the adjacent cylindrical surface 13 of drum 12. In the illustrated embodiment, edge finder 30 comprises: (i) a radiation source 32 which generates a spot 33 of radiation directed at adjacent surface 13; and (ii) a radiation detector 34 which detects radiation reflected from spot 33. Radiation source 32 and radiation detector 34 are both mounted to move with imaging head 16. Imaging head 16 is scanned axially in a sub-scan direction indicated by arrow 24, so that spot 33 crosses reference edge 15'. When spot 33 crosses reference edge 15', radiation detector 34 detects a change in the radiation reflected from spot 33. In this embodiment of the present invention, the location of a reference point 28A, 28B on reference edge 15' may be determined from the position of imaging head 16, when the change in radiation reflected from spot 33 is detected. Additional reference points on reference edge 15' may be detected by rotating drum 12 in either or both of main-scan directions 26 and repeating the above procedure.

Alternatively or additionally, edge finder 30 may comprise a mechanical probe tip which detects reference edge 15' by contact, or a capacitive sensor which detects a change in the electrical capacitance between the sensor and drum 12 as the capacitive sensor is scanned along a trajectory that crosses reference edge 15'.

Figure 6:
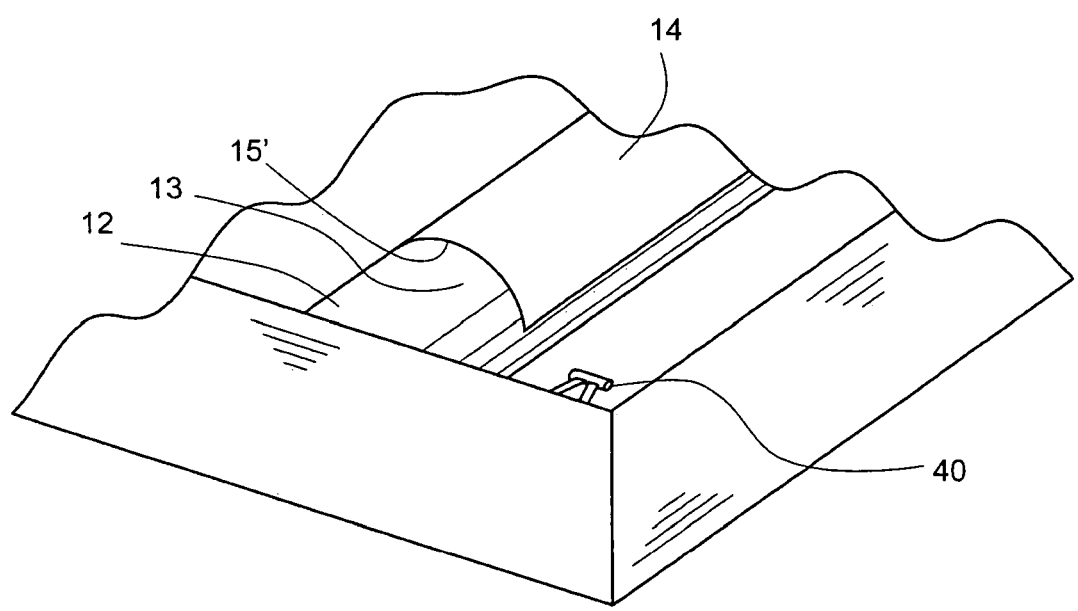
FIG. 6 is a schematic illustration of a plate-making machine according to one embodiment of the invention that comprises a camera-type edge finder.

In the embodiment of FIG. 6, a digital camera 40 that has a known position and orientation relative to drum 12 captures an image of reference edge 15'. The image is processed to identify reference edge 15' and to determine the locations of two or more reference points 28A, 28B on reference edge 15'. A line detection algorithm may be used to locate reference edge 15'. A straight line may be fitted to the located reference edge 15'. The positions of the two or more reference points 28A, 28B on reference edge 15' may be determined from the fitted line.

Digital camera 40 may be mounted in a fixed position with respect to drum 12, especially when plate-making machine 10 is configured such that plate 14 is mounted onto drum 12 with positional variance in the subs-scan direction 24 that does not exceed the field of view of camera 40. This embodiment may add additional constraints to a plate load mechanism of plate-making machine 10. This embodiment of the invention may however increase plate-making throughput by allowing imaging head 16 to be retraced back along sub-scan direction 24 after completing the imaging and unloading of a first plate, while loading and detecting the reference points of a second plate.

Throughput is an important consideration of a plate making system. A reduction in the imaging time or an increase in the plate-making throughput may be achieved by mounting a rectangular plate with its long edge aligned along a circumferential direction around the drum. Plate-making throughput improvements may be achieved by reducing the time required for edge detection and the determination of any plate skewing. Since a certain amount of time is required for the imaging drum 12 to reach a rotational imaging speed, it is preferable to ideally complete the edge detection and plate skew determination during the time imaging drum 12 is rotationally accelerating up to, or has reached the rotational imaging speed. If completed by the time the imaging drum 12 has reached the rotational imaging speed, imaging of the plate can commence without further significant delay.

Figure 7:
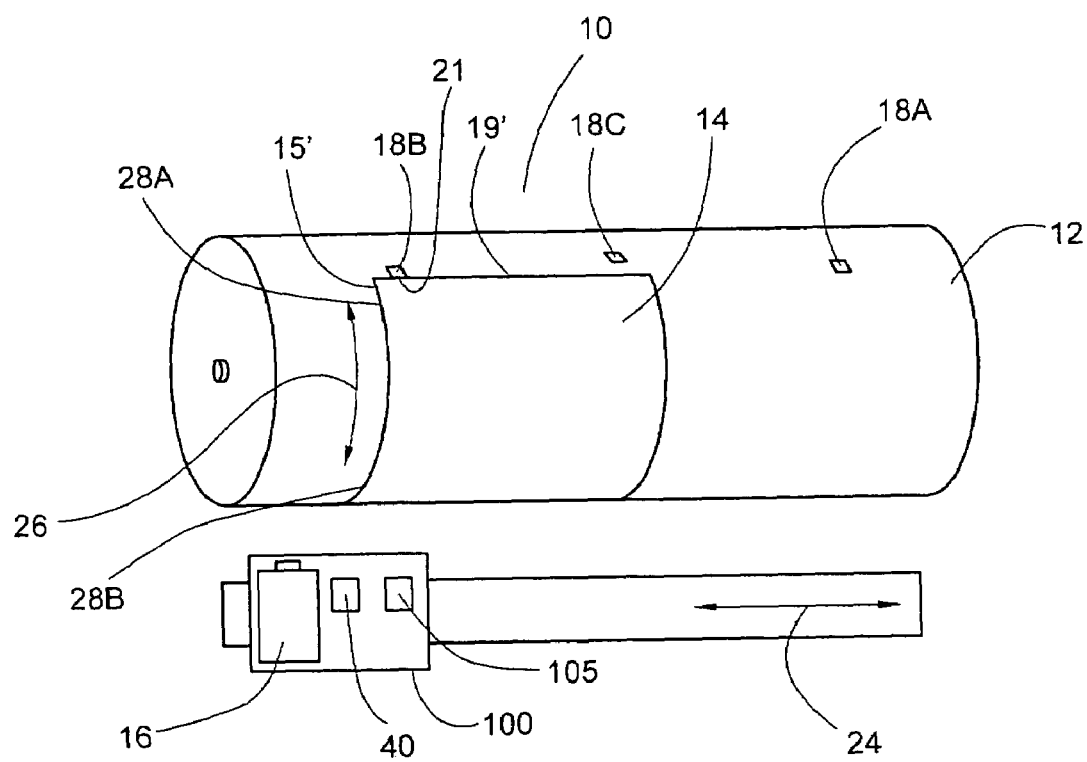
FIG. 7 is an isometric depiction of a printing plate mounted to a drum of a plate-making machine according to a particular embodiment of the invention.

FIG. 7 shows a preferred embodiment of the invention in which printing plate 14 is mounted on drum 12 of a plate-making machine 10. Plate-making machine 10 could be an external drum-type plate-making machine. Alternatively, the plate-making machine 10 could be an internal drum-type plate-making machine.

In the illustrated embodiment of the present invention shown in FIG. 7, plate 14 is mounted to a drum 12 of an external drum-type plate making machine preferably with its reference edge 15' (i.e. the longer edge of plate 14 in this embodiment) extending, at least partially, along a main-scan or circumferential direction 26 around drum 12. The shorter, orthogonal edge 19' of plate 14 touches at least one of reference pins 18A, 18B, 18C on drum 12 to provide at least a single orthogonal edge reference point 21.

A suitable clamping system (not shown) holds printing plate 14 on drum 12 of the plate making machine in a manner that leaves at least a portion of its reference edge 15' exposed. The clamping system may attach itself to orthogonal edge 19' and the opposing edge (i.e. parallel to orthogonal edge 19') of plate 14, leaving a majority of reference edge 15' exposed.

Plate-making machine 10 includes an imaging head 16 that is affixed to movable carriage 100 which is axially movable relative to drum 12 along a sub-scan direction represented by double-headed arrow 24. Plate-making machine 10 also includes illumination source 105 and digital camera 40. In this preferred embodiment of the present invention, illumination source 105 and digital camera 40 are attached to carriage 100. In other embodiments of the present invention, illumination source 105 and/or digital camera 40 may be attached to imaging head 16 itself. When at least digital camera 40 is affixed to carriage 100 or to imaging head 16, a digital camera with a relatively smaller field of view may be employed than if digital camera 40 was mounted in a fixed position with respect to imaging drum 12. A Digital camera 40 that may employ a small field of view includes the Black and White Ultra-Miniature Camera, Model WDH-2500, manufactured by the Weldex Corporation. In this embodiment of the present invention, digital camera 40 can be moved over a larger sub-scan distance than the field of view of digital camera 40 to find various points along reference edge 15'. Illumination source 105 and digital camera 40 may be employed to capture images of the at least two reference points 28A, 28B on reference edge 15'. In other embodiments of the present invention, illumination source 105 and digital camera 40 may be employed to capture digital camera images of various points along the reference edge 15' of each of a plurality of plates 14 mounted on drum 12. In other embodiments of the present invention, illumination source 105 illuminates a region that includes at least a part of reference edge 15' associated with least one point found on reference edge 15'. The at least one point may correspond to one or more of the at least two or more reference points 28A, and 28B. The region may also include an adjacent surface 13 of drum 12.

In yet other embodiments of the present invention, plate-making machine 10 may include a plurality of imaging heads 16. Each of the plurality of imaging heads 16 may be used to image at least one of a plurality of printing plates 14 mounted on drum 12. A separate digital camera 40 and illumination source 105 may be associated with each of the plurality of imaging heads 16 and be used to capture digital camera images of various points along the reference edge 15' of the corresponding printing plates that is imaged by the specific imaging head.

In preferred embodiments of the present invention, the digital camera images captured by digital camera 40 may be analyzed by one or more image data processors (not shown) to identify reference edge 15' and to determine the location of at least one point on reference edge 15'. The at least one point may include at least two reference points 28A, 28B on reference edge 15'. Controller 20 may include the one or more image data processors. Controller 20 may determine the location of the at least one point and determine the alignment of printing plate 14 relative to imaging drum 12. Controller 20 may provide the necessary instructions to impart print image 17 onto plate 14. When the location of a single point on reference edge 15' is determined, print image 17 may be imparted onto plate 14 in alignment with the determined single point and the position of plate 14 as mounted on registration pins 18. Controller 20 may include a processor to adjust print image data to produce adjusted print image data that aligns print image 17 on printing plate 14 relative to at least the determined single point. When the at least one point comprises at least two reference points 28A and 28B, controller 20 may impart print image 17 onto plate 14 in alignment with the at least two determined points. A line detection algorithm may be used to locate reference edge 15' in each of the captured digital camera images. A best-fit straight line may be fitted to the located reference edge 15'. The positions of the two or more reference points 28A, 28B on reference edge 15' may be determined from the fitted line. Referring back to FIG. 3, controller 20 may determine the necessary transformation in accordance with the determined positions of reference points 28A and 28B in block 108. The transformation is applied to print image data in block 110 to produce transformed print image data. The transformed print image data is then communicated to imaging head 16 to impart print image 17 in the desired alignment with reference edge 15'.

Figure 7A:
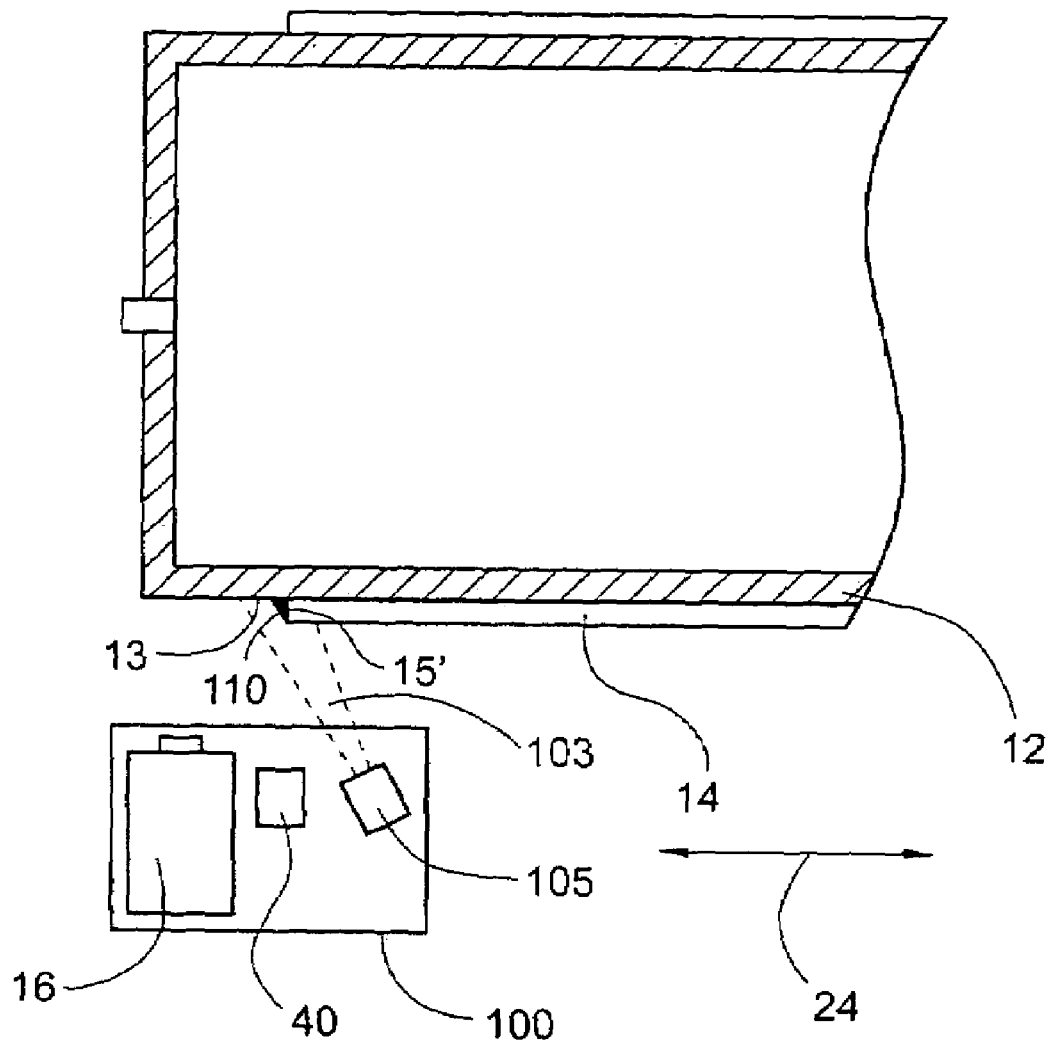
FIG. 7A shows a schematic partial cross-sectional view of a printing plate mounted to a drum of a plate-making machine according to a particular embodiment of the invention that comprises a digital camera and illumination source.

FIG. 7A shows a schematic partial cross-sectional view of printing plate 14 mounted on drum 12 as per a preferred embodiment of the present invention. In this preferred embodiment, carriage 100 is preferably moved along sub-scan direction 24 such that it reaches a point in which illumination source 105 illuminates one region that includes at least a part of reference edge 15' associated with least one point found on reference edge 15'. The at least one point may correspond to one or more of the at least two or more reference points 28A, and 28B. The region may also include an adjacent surface 13 of drum 12.

Illumination source 105 may emit light 103 to create a shadow 110 at the at least a part of reference edge 15'. Shadow 110 may be used to differentiate or emphasize a contrast in the captured images of reference edge 15' and adjacent surface 13 of imaging drum 12. Improved contrast between the adjacent drum surface 13 and reference edge 15' increases the probability of successfully distinguishing between reference edge 15' (and it associated reference points) and scratches or other imperfections or features found on the printing plate 16 and/or the adjacent drum surface 13 found on the captured images. Light source 105 is preferably oriented such that for any reference edge 15' within the field of view of digital camera 40, shadow 110 is cast against an adjacent drum surface 13. Illumination source 105 may be angled such that the width of shadow 110 is sufficiently wide enough to be visible for a given digital camera magnification.

Figure 7B:
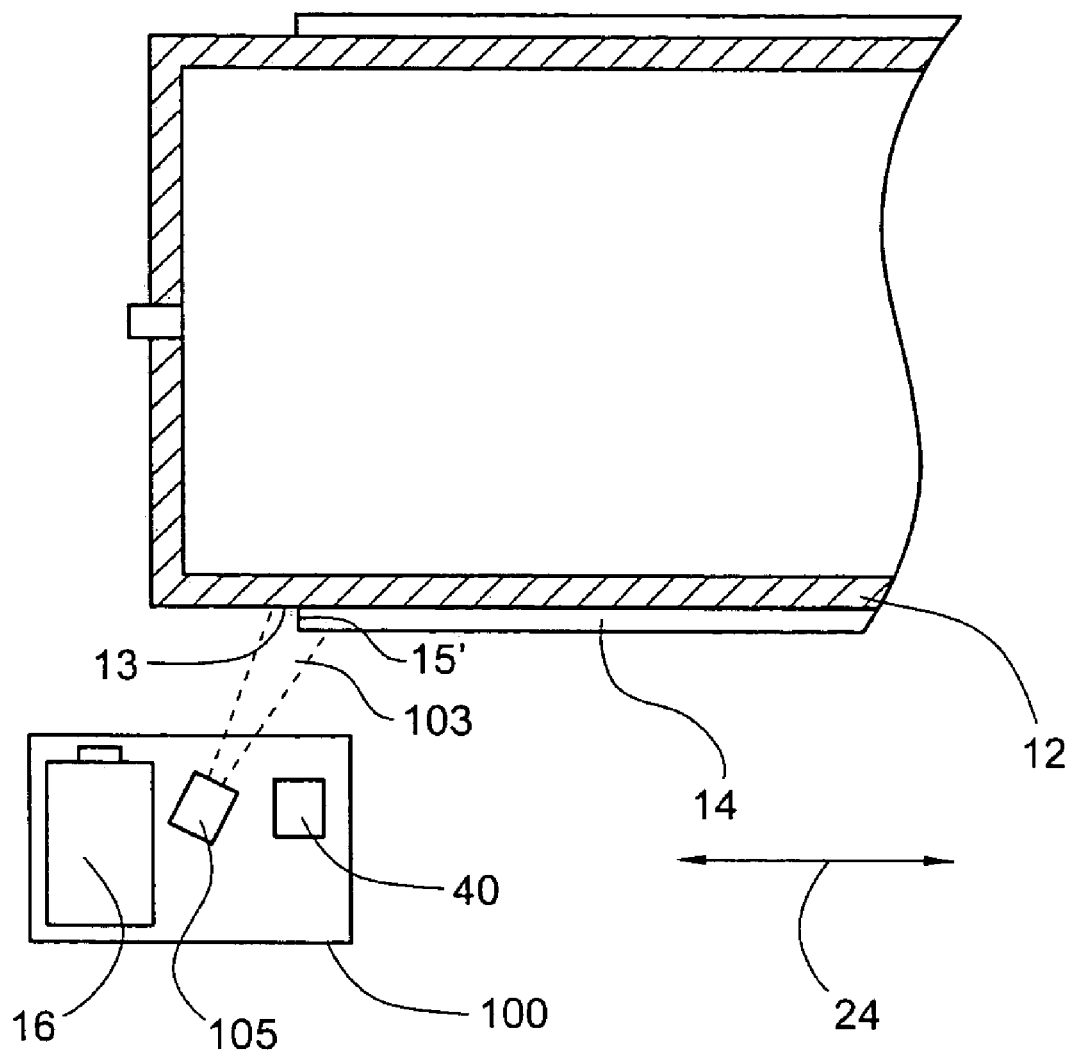
FIG. 7B shows a schematic partial cross-sectional view of a printing plate mounted to a drum of a plate-making machine according to another particular embodiment of the invention that comprises a digital camera and illumination source.

FIG. 7B shows a schematic partial cross-sectional view of printing plate 14 mounted on imaging drum 12 as per another preferred embodiment of the present invention. In this preferred embodiment of the present invention, carriage 100 is moved to a sub-scan position such that illumination source 105 illuminates a region that includes at least a part of reference edge 15' and an adjacent surface 13 of drum 12. If print plate 16 includes a photo-sensitive or thermal-sensitive imagable coating (not shown) that may not be easily visually distinguished from the adjacent surface 13 of drum 12, reference edge 15' may not be reliably detected in the digital camera images captured by digital camera 40. If the imagable coating is dark in nature, forming a shadow at the boundary of the reference edge 15' may not provide a contrast to distinguish reference edge 15' from the adjacent drum surface 13. Typically, printing plates are formed by coating a metal web (typically aluminum or an aluminum alloy) substrate with an imagable coating. The coated web is typically cut or sheered to produce print plates of the desired size and shape. The typically reflective sheared edged of the plate corresponding to reference edge 15' may provide suitable contrast to distinguish the reference edge 15' when illuminated by the illumination source 105 of the embodiment of the present invention shown in FIG. 7B.

Figure 7C:
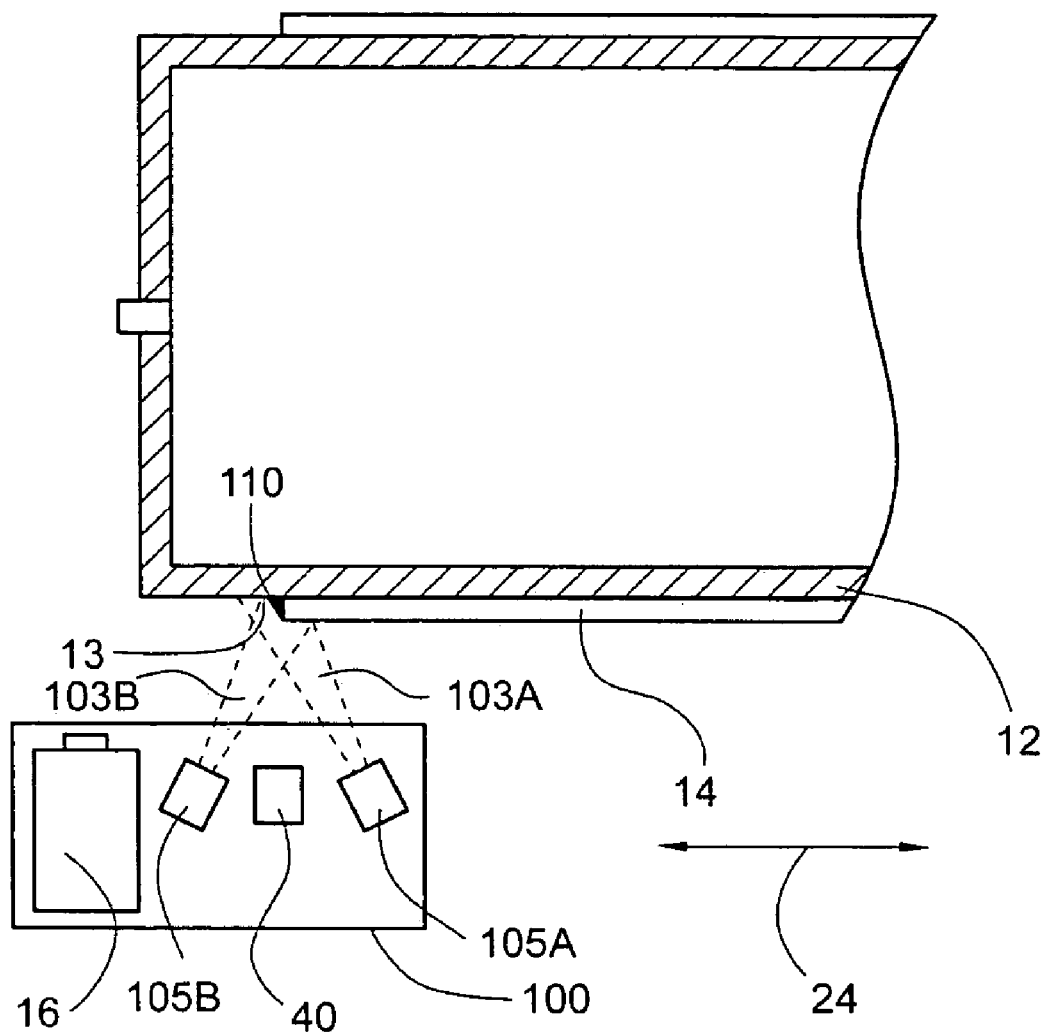
FIG. 7C shows a schematic partial cross-sectional view of a printing plate mounted to a drum of a plate-making machine according to yet another particular embodiment of the invention that comprises a digital camera and a plurality of illumination sources.

Detecting and interpreting the presence of reference edge 15' with camera 40 may produce erroneous results, even when an illumination source 105 is positioned to establish a shadow 110 to improve the contrast between at least a part of reference edge 15' and the adjacent drum surface 13. Imaging drum 12 features such as drum grooves which may be used to affix various clamping means employed to secure plate 14 to imaging drum 12 may lead to the creation of images that may include image features similar to those of reference edge 15' or shadow 110. FIG. 7C shows a schematic partial cross sectional view of printing plate 14 mounted on imaging drum 12 as per yet another preferred embodiment of the present invention. Two light sources 105A and 105B are employed. As in the embodiment of the invention shown in FIG. 7A, carriage 100 is preferably moved along sub-scan direction 24 such that it reaches a point in which a shadow 110 is created at reference edge 15' by illumination source 105A which emits beam of light 103A. Again, shadow 110 may be used to differentiate or emphasize contrast between at least a part of reference edge 15' and an adjacent surface 13 of imaging drum 12 to capture a first set of digital camera images at various reference points along the at least a part of reference edge 15'. After the first set of images are captured, illumination source 105A may be deactivated and illumination source 105B is used to illuminate the at least a part of reference edge 15' with beam of light 103B. Illumination source 105B may be activated to illuminate the at least a part of reference edge 15' while a second set of digital camera images are captured by digital camera 40. Carriage 100 may or may not move during the time between the capture of the first and second set of digital camera images. The first and second set of digital camera images may then be compared with each other. The at least a part of reference edge 15' and its associated reference points will be defined more distinctly since the camera pixel data corresponding to the shadow 110 will be distinguishable.

Typically, increasing the field of view of digital camera 40 will increase the throughput of the detection of the reference points since a greater sub-scan range may be searched more quickly. In another embodiment of the present invention, digital camera 40 may be zoomed out to achieve a greater field of view. It should be understood that if illumination source 105 is employed to create a shadow 110 at reference edge 15', this shadow may no longer be sufficiently large enough to be reliably discerned by image data processors when the digital camera images are taken with camera 40 that employs a greater field of view. A typical field of view that may have sufficient resolution to distinguish shadow 110 is 8 to 10 microns per pixel (digital camera 40 having a 4 mm high (main-scan direction) by 6 mm wide (sub-scan direction) frame.

To determine the alignment of printing plate 14 relative to imaging drum 12 as well as drum transformation for print image data, the one or more image data processors requires positional information (preferably with respect to imaging drum 12) of the captured camera data of the reference points 28A and 28B. Digital camera 40 may attached to a fixed point within plate-making machine 10 or to an axially translating point such as carriage 100 or imaging head 16. In either case, circumferential or main-scan information of the captured digital camera image at a given reference point may be obtained from data provided by imaging drum 12's rotational position encoder (not shown). The encoder defines specific main-scan positions of imaging drum 12 that are typically indexed to an index start point. The index start point may be defined by at least one of the registration pins 18A, 18B and 18C of drum 12. The encoder provides imaging drum rotational position information that is used to coordinate the activation of imaging head 16 as it translates along sub-scan direction to correctly impart an image onto printing plate 14. Main-scan positional calibration of digital camera 40 may include capturing digital camera images of a feature incorporated in the surface of imaging drum 12; the main-scan positional coordinates of the feature being known.

The sub-scan positional coordinates of the captured images at the reference points must also be known, especially when digital camera 40 is mounted on carriage 100 or imaging head 16. Carriage 100 typically moves axially in synchronism with the rotation of drum 12. Positional control of carriage 100 may be accomplished by numerous methods known in the art. Sub-scan positional calibration of digital camera 40 may be accomplished by several methods. One method may include capturing digital camera images of a feature incorporated in the surface of imaging drum 12; the sub-scan positional coordinates of the feature being known. Another method may include additionally detecting a specific reference point on edge 15' by another means such as a focus laser that is part of imaging head 16. The sub-scan position detected by digital camera 40 is then compared to the corresponding coordinates determined by the focus laser. Yet another method may include imparting an image feature onto printing plate 14 with imaging head 16. Carriage 100 may be positioned to a specific sub-scan position to capture a digital camera image of the feature.

Digital camera pixel scaling calibration determines the number of microns per camera pixel. Digital camera pixel scaling calibration may be determined by imaging a feature of known size and assessing the how many pixels wide it is. Yet another method of pixel scaling calibration may include imaging a feature onto printing plate 14 at a first known sub-scan position. Carriage 100 may then be moved to a second known sub-scan position to image the feature again. Digital camera 40 may be used to capture a digital camera image of the two imaged features. The distance between the two imaged features being the same as the distance between the first and second known sub-scan positions.

In preferred embodiments of the present invention, imaging head 16 and digital camera 40 are moved axially in the sub-scan direction indicated by arrow 24, while imaging drum 12 is rotated. Digital camera 40 may capture digital camera images at various main-scan positions including positions corresponding to the at least two reference points 28A, and 28B. Digital camera 40 may send data corresponding to each of the digital camera images to an image data processor which identifies a representation of the at least a part of reference edge 15' within at least one of the images. The position of the reference edge representation within the camera images along with sub-scan positional information of the carriage (at the time the camera images were taken) may be used to determine a sub-scan positional coordinate of the at least two reference points 28A and 28B. The main-scan coordinates of the at least two reference points 28A and is 28B determined in accordance with data provided by the drum rotational encoder.

Imaging drum 12 is preferably rotating when camera 40 is capturing digital camera images of at least a part of reference edge 15'. While imaging drum 12 is rotating, carriage 100 may or may not be moving. During this rotation, imaging drum 12 may be accelerating or decelerating to achieve a steady state rotational imaging speed or may be rotating at a steady state rotational imaging speed. By rotating imaging drum 12 while capturing the images, plate-making throughput may be increased especially when drum 12 is accelerating up to, or has reached a desired rotational imaging speed. Imaging drum 12 may be rotating with a rotational speed that is greater than, or less than a rotational speed required for imaging.

Referring back to FIG. 7A, illumination source 105 may be flashed or strobed to create shadows 110 along various point along reference edge 15'. Illumination source 105 may be flashed to detect the positions of at least two reference points 28A and 28B on reference edge 15' while imaging drum 12 is rotating. Illumination source 105 may be flashed to minimize or reduce the undesired exposure of a photosensitive coating of print plate 14 during the detection of various points along reference edge 15'. Illumination source 105 may be flashed at various rotational or main-scan positions of imaging drum 12. Imaging drum 12 may have an associated rotational position encoder, and the encoder's positional information may be used to strobe or flash illumination source 105 at configurable and precisely controlled drum rotational positions. These drum positions may correspond to the at least two reference points 28A and 28B on reference edge 15'. The flashing of illumination source 105 may be synchronized with the drum encoder by electronic means.

If imaging drum 12 is rotating during the capturing of images by camera 40, a flashed pulse of light emitted by illumination source 105 should be sufficiently brief since any specific point illuminated on the plate 14 an/or drum 12 surfaces will be moving during the illumination, thus making it more difficult to capture an digital camera image of that specific point. Typically, when illumination source 105 includes a state-of-the art LED (such as model LTL33BCWK5AT manufactured by Lite-On IT Corp.), strobe or flash periods can be as low as 20 μs or less. At 600 RPM, the surface of a rotating 1.5 meter circumference imaging drum moves 15 m/s or 0.3 mm during the emitting of a pulse of light with a pulse width of 20 μs. The LED flash is typically significantly faster than the frame capture time of 33 ms (at 30 frames per second) of digital camera 40. Frame rates for NTSC compatible digital cameras are typically 30 frames per second, whereas frame rates for PAL compatible digital cameras are typically 24 frames per second.

In some preferred embodiments of the present invention, the flashing or strobing of digital camera 40 may be indexed or synchronized with the imaging drum encoder. These embodiments of the invention may not however be suitable when imaging drum 12 is rotating at relatively high speeds that may cause a given point on the surface of drum 12 to travel a significant distance during the relatively long frame time of digital camera 40.

Digital camera 40 may employ CCD (charge coupled device) or CMOS (complementary metal oxide semiconductor) image sensors for capturing images digitally. Both types of digital cameras convert light into electric charge and process it into electronic signals. In a CCD based camera, every pixel's charge is transferred through a very limited number (often one) of output nodes to be converted to a voltage, buffered, and sent off-chip as an analog signal. All of the pixels may be devoted to capture light, and the output's uniformity (a key factor in image quality) is high. In a CMOS based camera, each pixel has its own charge-to-voltage conversion, and the sensor often also includes digitization circuits, so that the chip outputs digital bits. These other functions may reduce the area available for light capture, and with each pixel doing its own conversion, uniformity may be lower. The CMOS chip however requires less off-chip circuitry for basic operation. Embodiments of the present invention may include CCD based or CMOS based digital cameras. Both types of cameras may be configured to produce an NTSC (or PAL) format video stream. Different levels of illumination may however be require for each embodiment, with CMOS cameras typically requiring more light.

Digital camera 40 typically includes an array that is made up of arrayed rows or lines of light sensitive pixels that are used to capture a digital camera image frame. The entire frame is typically changed at rate that is typically 30 frames per second for NTSC compatible cameras and 24 frames per second for PAL compatible cameras. Frame information or data representing the illumination of the pixels is typically sent to an image data processor in the form of two fields (ODD and EVEN) rather than data corresponding to the frame in its entirety. The ODD field typically corresponds to the odd illuminated lines of the array whereas the EVEN field typically corresponds to the even illuminated lines of the array. The two fields interlaced together form the full frame.

Digital camera 40 typically is employed in one of two modes of operation, field integration mode and frame integration mode. In field integration mode, digital camera 40 may first read the ODD field. The ODD field data is then transmitted to the image data processor during the time that digital camera 40 is gathering light for illumination of the EVEN field. This procedure is then reversed so that digital camera 40 reads the EVEN field and transmits it to the image processing electronics while gathering light for the ODD field. In field integration mode, light is gathered at any one time by the array for either one field or the other, but not both. For a typical frame capture time of ⅓₀ sec, each field accordingly gathers light for an integration time of ⅙₀ sec. When illumination source 105 is flashed to illuminate a specific point along reference edge 15', a portion of the flashed illumination may be captured in each field. Such an occurrence may reduce the brightness of the illumination captured in each field, and may be undesirable for the subsequent image processing. In field integration mode, the full brightness of a flashed illuminated pulse of light will typically only appear in at most one of the two fields. Despite the fact that all the pixels had illumination incident on them, only half the pixels captured the illumination, and it becomes necessary to ascertain which half was illuminated.

In frame integration mode, digital camera 40 does not gather light for the ODD and EVEN fields in a sequential manner. Light is gathered by both fields of a given frame while one field of a previously gathered frame is being transmitted to an image data processor. An integration period for a given field is a length of time in which light is gathered by the array for the given field. The start of each integration period for a given field is offset from the start of the integration period of the other field by a period of time taken to read out the image data of the other field. If digital camera 40 is used in frame integration mode, a flashed pulse of light emitted by illumination source 105 may be detected in both the ODD and EVEN fields of a given frame. A flashed pulse of light emitted by illumination source 105 may also be detected during the integration of the EVEN lines of a current frame and the ODD lines of a subsequent frame (or visa versa depending on the readout order of the ODD and EVEN fields). If an image data processor is configured to process only one of the two fields (for example, the EVEN field), the flashed pulse of light will be seen regardless when it occurred relative to the EVEN or ODD integration periods. The entire flashed pulse will be present in at least one field (ODD or EVEN) of a given frame. Digital camera 40 and flashed illumination source 105 need not be synchronized to one another if frame integration mode is employed. When digital camera 40 is in frame integration mode, flashed illumination source 105 is typically synchronized with imaging drum 12's rotational position via the drum's encoder. Frame integration mode permits the use of simpler, inexpensive, free-running digital cameras that typically employ common NTSC or PAL video formats, and continuously take digital camera images.

Embodiments of the present invention in which field integration mode is employed typically require synchronizing digital camera 40 to both the imaging drum 12 and flashed illumination source 105 in addition to synchronizing flashed illumination source 105 to drum 12's rotational position, so that an entire flashed pulse of light may be caught by a single camera field. This approach typically requires more expensive cameras that have additional means to instruct the camera to record an image at a desired point in time. When digital camera 40 is operated in field integration mode, there is a brief period of camera downtime or blindness between successive frames as the array is read. A 20 μs or less pulse of light emitted by illumination source may occasionally occur in this blindness period leading to missed images. This further may establish a need for synchronizing camera 40 with illumination source 105 when field integration mode is employed.

Some relatively inexpensive digital cameras that typically employ common NTSC or PAL video formats can be synchronized ("external sync" mode) to imaging drum 12. Typically the frequency of the synchronizing signal must be within a few percent of the 60 fields per second for NTSC (or 48 fields per second for PAL). This typically requires a substantially steady imaging drum 12 rotation. Such a steady rotation may take a few seconds to stabilize and may preclude taking digital camera images during the acceleration and deceleration of drum 12.

Methods that may overcome any limitations created by a blindness period without synchronizing camera 40 include spinning the drum at select predetermined speeds relative to digital camera 40's frame rate such that a maximum of one flash may only be missed per two drum revolutions. Yet another method may include holding carriage 100 stationary at a first sub-scan position while continuously flashing illumination source 105 until it is detected by camera 40, and then step carriage 100 to a next sub-scan position and repeat the detection. These methods may reduce plate-making throughput.

In a preferred embodiment of the present invention shown in FIG. 7, at least two reference points 28A and 28B on a reference edge 15' of printing plate 14 are detected. The reference edge 15' may or may not correspond to a long edge of a rectangular shaped printing plate 14. The detection preferably takes place while imaging drum 12 is rotating, either at a constant speed or is accelerating. Illumination source 105 preferably includes an LED such as model # LTL33BCWK5AT produced by the LITE-ON IT Corp. Illumination source 105 is flashed or strobed to illuminate a region including at least a part of reference edge 15'. The region may also include an adjacent drum surface 13. Illumination source 105 may only illuminate the region when a desired point on reference edge 15' rotates to a predefined and preferably configurable rotational position relative to illumination source 105. The desired point may correspond to one of the at least two reference points 28A and 28B. Each of the flashed pulses of light emitted by illumination source 105 is preferably kept short to minimize the amount of movement that reference points 28A and 28B undergo during their illumination. Preferably, illumination source 105 is arranged so that a shadow 110 is cast by the at least a part of reference edge 15' onto adjacent drum surface 13 at each of the at least two reference points 28A and 28B. Illumination source 105 is preferably affixed to carriage 100 or to imaging head 16. Digital camera 40 is positioned to capture digital camera images at various points along reference edge 15', as reference edge 15' is rotated past the field of view of digital camera 40. Digital camera 40 may continuously capture images at various points along reference edge 15' as reference edge 15' is continuously rotated past the field of view of digital camera 40. Digital camera 40 is preferably positioned to capture images at the at least two reference points 28A and 28B when each of the reference points is illuminated by a flashed pulse of light emitted by illumination source 105. Digital camera 40 may capture images of additional points along reference edge 15'. The additional points may or may not be illuminated by illumination source 105. Digital camera 40 may be mounted on carriage 100 or imaging head 16 in a desired relationship with illumination source 105.

Referring back to FIG. 7, digital camera 40 is preferably operated in frame integration mode while continuously capturing a sequence of video frames, the sequence contain one or more frames which capture digital camera images of each of the flashed pulses. The sequence of video frames is read out to one or more image data processors. Each frame will consist of a brightness level of each of the pixels in the array. Image processing software may distinguish frames containing the pulsed light images from those that do not using a method known as "frame differencing". Frame differencing is used to find a given frame containing an image of the flashed pulse of light. For each pixel image in a given frame, the brightness of that pixel image is subtracted from the brightness of that same pixel in a previous frame. The presence of the flashed pulse is determined when a large number of significant differences are observed. To minimize the effects of noise, these differences may be considered to be significant only when they are above a predetermined threshold value. If the images have been captured in frame mode, the pulses of light may be captured in both the ODD and EVEN fields of a given frame or of two successive frames. The image data processor is preferably configured to frame difference only one of the two possible fields (for example, the EVEN field) to ensure that the flash will be seen regardless of when it occurred during an EVEN or ODD field integration. The image data processor may also compare pixel images only in a small, predefined region of the image to save computational time.

In another embodiment of the present invention, another method may be used to distinguish fields that contain an image of a flashed pulse of light. An image data processor may define a predetermined number of the brightest pixel images in a given field. Experimentation has shown that a suitable number is 100, but other numbers are also within the scope of the present invention. The brightness of these pixels images is averaged to express the average brightness of the given field in terms of a single value. This process is repeated for all fields in the video stream. The average brightness of a field that contains an image of a flashed pulse of light (i.e. the pulsed light field") is dramatically brighter than fields not containing such an image. To offset changes in ambient light, the average brightness values of a number of successive fields that did not contain a pulsed light image (i.e. the "non-pulsed light fields") may in turn be averaged and then compared to the average brightness of each new successive field to identify the pulsed light fields. Experimentation has shown that averaging 5 successive non-pulsed light fields produces suitable results. Averaging other numbers of successive non-pulsed light fields is also within the scope of the present invention. The averaged successive non-pulsed light fields are typically updated with each new non-pulsed light field that is analyzed. By identifying the 100 brightest pixels in the image this method may distinguish even the smallest visible reference edge against potentially the darkest part of the drum surface. This method is also relatively immune to slow changes in the average illumination of the plate 14 (for example when ambient light enters the digital camera 40) because the average brightness of non-pulsed light field is constantly updated for use in the comparison with the pulsed light fields.

After a field containing the flashed pulse of light has been determined, the image of the pixels in each vertical column of the array are added in a process known as "vertical integration". The image of the pixels in each vertical column of the frame array are chosen from the particular field determined to be a pulsed light field during the frame differencing. The vertical column of the array typically may refer to an array axis substantially aligned with main-scan direction 26. Vertical integration includes a process of adding the brightness value of each pixel image in each vertical column of the field. The result is a sequence of "n" numerical values where "n" equals the width of each captured frame in pixels.

A prototype edge mimicking an "ideal" plate edge image may also be created in a vertically integrated form. The prototype edge is a representation of what an "ideal" plate edge would appear as. Typically, the prototype edge is narrower in terms of a number of pixel values than the video field. An ideal edge image may consist of a uniform dark region that may represent an image of an ideal shadow adjacent to a brighter region that may represent an image of an ideal plate edge. The prototype edge may consist of a predetermined uniform dark region corresponding to a low brightness sum during vertical integration, adjacent to a predetermined lighter area corresponding to a higher brightness sum during vertical integration. In another embodiment of the present invention, the light and dark values used to generate the prototype edge may be based on the average brightness values taken from the actual video fields being analyzed. This may further facilitate the process of finding the various points on reference edge 15' since the prototype edge and image match more closely.

The Haar transform is an established mathematical technique in image processing. In a preferred embodiment of the present invention, the Haar transform is used to "pattern match" a prototype edge with the sequence of values derived from vertically integrating the digital camera image pixels. The Haar transform is applied to a (narrower) sequence of vertically integrated prototype edge values to produce a first vector. The Haar transform is also applied to a portion of a sequence of the digital camera image vertically integrated values to produce a second vector. The dot product of these two vectors is referred to as correlation. Correlation is a measure of the pattern match between the prototype edge and an edge found at that location in the digital camera image. This process is repeated for alternate portions of the sequence of the digital camera image integrated values, to produce a correlation graph. Each of the alternate portions typically starts at each consecutive pixel location of the digital camera image. The location of maximum correlation (i.e. the global maximum) has a high probability of corresponding to the reference edge portion in the image.

The global maximum of the correlation graph may in some cases, lead to an erroneous result. There may be other local maxima in the graph, one of which may correspond to the reference edge. A local maxima may be located by applying a similar wavelet transform to the correlation graph. A coiflet transform operation may be applied to the entire correlation graph, producing a coiflet transform vector. A threshold may be selected wherein values below the threshold are reduced to zero. The transform operation may then be reversed and a modified version of the correlation graph reproduced. This technique may be commonly employed in image compression. In the present invention, the compression applied may be of a magnitude that the modified version of the correlation graph is a sequential series of width and height scaled coiflet mother wavelets. Each of the local maxima present in the original correlation graph will typically become the center (peak) of one of the mother wavelets. Finding the locations of the local maxima is simply a matter of listing the locations of the mother wavelets. In this way, an image may have several possible choices of locations for the imaged portion of the reference edge, some more likely to be correct than others.

It is to be understood that the present invention is not limited to the use of the Haar transform and suitable correlation or convolution algorithm may be used to distinguish between the prototype edge and video images. In addition, speed improvements may be made by setting Haar transform vector values to zero if they are under a predetermined threshold before taking the dot product. The present invention may further use any suitable image processing method and associated edge detection algorithm to distinguish the portion of reference edge 15' captured in the video frames. The position of the least two reference points 28A and 28B may be determined by the identification of these locations and from imaging drum 12 and carriage 100 positional information during the capturing of the images at reference points 28A and 28B. The determined locations of the at least two reference points reference 28A and 28B may then be used to determine a transform to apply to print image data such that when the transformed print image data is communicated to imaging head 16 and its associated radiation source, print image 17 is substantially aligned with reference edge 15'.

Printing plate 16 and imaging drum 12 may have surface imperfections that may appear to produce images that may obscure the contrast of the reference edge 15' at the detected positions. The surface imperfections themselves may have a form and shape that may lead to erroneous results if the edge detection algorithms employed mistakenly interpret the imperfections as part of reference edge 15'. Erroneous results may also occur if the edge detection algorithms interpret regular imaging drum 12 features as part of reference edge 15'. Such features may include, but are not limited to circumferential magnetic or vacuum grooves used for plate clamping purposes. A plurality of locations oriented along the main-scan direction 26 may be imaged by digital camera 40 and defined by a suitably chosen edge detect algorithm. The plurality of locations may be greater in number than the at least two reference points 28A and 28B. If each location produces at least one edge value, a best-fit straight line may then be fitted through these points. The best-fit straight line forms a relationship between the determined sub-scan or axial locations of the plurality of points and their corresponding circumferential locations to assess the accuracy of the determined locations with respect to the straight line that theoretically represents a straight plate edge.

Each digital camera image from the plurality of locations along the main-scan direction may instead result in a plurality of possible reference edge positions in at least one of the locations, each associated with a figure of merit. An algorithm for fitting a straight line can be designed to select from the possible reference edge locations, with a higher weighting for edge locations with a high figure of merit. If one or a few of the high figure of merit reference edge locations do not lie in a straight line and a lower figure of merit edge location does lie nearer the straight line, it may be selected instead. Standard methods for best straight-line fitting may be applied to the selected set of reference edge locations. The locations of reference points 28A and 28B will typically lie on, or very close to the fitted straight line. Once the location of the at least two reference points 28A and 28B confirmed and/or adjusted, the transformation for print image data may be determined.

Certain implementations of the invention comprise computer processors that execute software instructions that cause the processors to perform a method of the invention. For example, one or more data processors in controller 20 may implement method 100 of FIG. 3 by executing software instructions in a program memory accessible to the processors. The invention may also be provided in the form of a program product. The program product may comprise any medium which carries a set of computer-readable signals comprising instructions which, when executed by a computer processor, cause the data processor to execute a method of the invention. Program products according to the invention may be in any of a wide variety of forms. The program product may comprise, for example, physical media such as magnetic data storage media including floppy diskettes, hard disk drives, optical data storage media including CD ROMs, DVDs, electronic data storage media including ROMs, flash RAM, or the like or transmission-type media such as digital or analog communication links.

As will be apparent to those skilled in the art in the light of the foregoing disclosure, many alterations and modifications are possible in the practice of this invention without departing from the spirit or scope thereof. For example, The present invention may generally employ any apparatus and/or method of clamping plate 14, to the surface of drum 12 of the plate-making machine, so long as at least a portion of reference edge 15' is exposed. Accordingly, the invention should be considered independent of the particular clamping technique employed.

Because plate 14 may be oriented on drum 12 of the plate making machine with its longer, reference edge 15' extending (at least partially) circumferentially around drum 12 and its shorter, orthogonal edge 19' extending (at least partially) parallel to the axis of drum 12, there may be non-imaged regions (not shown) adjacent to orthogonal edge 19' and adjacent to the edge opposing orthogonal edge 19', where the clamping system of the plate making machine secures plate 14 to drum 12 during imaging. Such non-imaged regions may be exposed and/or treated prior to printing, so that ink does not adhere to these non-imaged regions during printing. This exposure and/or treatment conserves ink.

Accordingly, the scope of the invention is to be construed in accordance with the substance defined by the following claims:

What is claimed is:

1. A method of imparting a print image on a printing plate, the method comprising:
    a) mounting the printing plate on an imaging drum in an orientation wherein a reference edge of the printing plate extends around the drum in a substantially circumferential direction;
    b) determining a location of at least one point on the reference edge, wherein the determining comprises for each point:
        i) illuminating a region, the region comprising at least a part of the reference edge associated with each point,
        ii) capturing at least one digital camera image of the region, and
        iii) locating the at least a part of the reference edge in the digital camera image, and
    c) imparting the print image on the printing plate in alignment with at least the determined location of the at least one point.

2. A method as in claim 1, wherein the at least one point comprises at least two circumferentially spaced apart points on the reference edge, and wherein the method further comprises:
    a) transforming print image data representing the print image in accordance with the determined locations of the at least two circumferentially spaced apart points, to yield transformed print image data; and,
    b) imparting the print image on the printing plate using the transformed print image data, the imparted print image aligned with the reference edge.

3. A method as in claim 1, comprising an illumination source operable for the illuminating, the method further comprising moving the illumination source in an axial direction relative to the imaging drum during the illuminating.

4. A method as in claim 1, comprising a digital camera operable for the capturing of the at least one digital camera image, the method further comprising moving the digital camera in an axial direction relative to the imaging drum during the capturing.

5. A method as in claim 1, comprising an illumination source operable for the illuminating, the method further comprising flashing of the illumination source during the illuminating.

6. A method as in claim 5, wherein the flashing of the illumination source comprises emitting a pulse of light with a pulse width less than 20 μs.

7. A method as in claim 5, comprising rotating the imaging drum during the flashing of the illumination source.

8. A method as in claim 7, wherein the rotating the imaging drum comprises at least one of:
    a) accelerating the imaging drum,
    b) decelerating the imaging drum, and
    c) rotating the imaging drum at the constant rotational speed.

9. A method as in claim 7, wherein the flashing of the illumination source comprises flashing the illumination source when each point rotates to a predetermined rotational position relative to the illumination source.

10. A method as in claim 9, further comprising continuously capturing a sequence of digital camera images as the imaging drum is rotated.

11. A method as in claim 1, wherein the illuminating comprises forming a shadow in the region, the shadow formed at the at least a part of the reference edge.

12. A method as in claim 1, comprising:
    a) capturing a first digital camera image of the region,
    b) forming a shadow in the region, the shadow formed at the at least a part of the reference edge,
    c) capturing a second digital camera image of the region, wherein the region comprises the shadow, and
    d) locating the at least a part of the reference edge by comparing the first and second digital camera images.

13. A method as in claim 1, wherein the determining the location of the at least one point comprises determining a rotational position of the imaging drum at each point.

14. A method as in claim 4, wherein the determining the location of the at least one point comprises at least one of:
    a) determining a rotational position of the imaging drum at each point, and
    b) determining an axial position of the digital camera relative to the drum.

15. A method as in claim 1, comprising a digital camera operable for the capturing of the at least one digital camera image, the method comprising operating the digital camera in one of:
    a) a field integration mode, and
    b) a frame integration mode.

16. A method as in claim 1, comprising a digital camera operable for the capturing of the at least one digital camera image, wherein the at least one digital camera image is captured in one of:
    a) at least one of an ODD and EVEN field of a first video frame captured by the digital camera, and
    b) at least one of the ODD and EVEN fields of the first video frame and at least one of an ODD and EVEN field of a second video frame captured by the digital camera.

17. A method as in claim 16, further comprising emitting a flashed pulse of light during the illuminating, wherein the at least one digital camera image comprises an image illuminated by the flashed pulse of light.

18. A method as in claim 17, wherein the image of the flashed pulse of light is captured in one or more video frames of a plurality of video frames captured by the digital camera, the method further comprising distinguishing the one or more video frames from the rest of the plurality of video frames by comparing a brightness level of a given pixel image in each of the plurality of video frames.

19. A method as in claim 18, further comprising distinguishing the one or more video frames from the rest of the plurality of video frames by comparing the same field of each of the plurality of video frames.

20. A method as in claim 18, wherein the locating the at least part of the reference edge comprises applying a correlation algorithm to distinguish an image of the at least a part of the reference edge from a prototype edge.

21. A method as in claim 20, wherein the applying the correlation algorithm comprises applying a Haar transform.

22. A method as in claim 21, wherein the applying the correlation algorithm comprises applying a coiflet transform.

23. A method as in claim 2, wherein the locating the at least a part of the reference edge further comprises performing a line detection algorithm.

24. A method according to claim 1, wherein the printing plate is substantially rectangular in shape, comprising a pair of longer edges and a pair of shorter edges, and wherein the reference edge is one of the longer edges.

25. A method of determining an alignment of a printing plate relative to an imaging drum on which the printing plate is mounted, the method comprising:
   a) determining a location of at least one point on a reference edge of the printing plate, wherein the reference edge extends around the imaging drum in a substantially circumferential direction; the determining a location comprising, for each point:
      i) illuminating a region, the region comprising at least a part of the reference edge associated with each point,
      ii) capturing at least one digital camera image of the region with a digital camera and
      iii) locating the at least a part of the reference edge in the digital camera image,
   b) determining the alignment of the printing plate at least in part from:
      i) the location of the at least a part of the reference edge in the digital camera image of each point, and
      ii) a position of the digital camera relative to the imaging drum during the capturing of the at least one digital camera image of each point.

26. A method as in claim 25, wherein the at least one point comprises at least two circumferentially spaced apart points on the reference edge.

27. A method as in claim 25, wherein the imaging drum comprises at least one registration pin in contact with an edge of the printing plate, the method further comprising determining the alignment of the printing plate from a position of the at least one registration pin.

28. A method as in claim 25, wherein the digital camera is mounted on a carriage operable for moving in an axial direction relative to the imaging drum, the method further comprising determining the alignment of the printing plate from an axial position of the carriage.

29. An apparatus for imparting a print image on a printing plate, the apparatus comprising:
   a) a substantially cylindrical imaging drum comprising means for securing the printing plate in an orientation wherein a reference edge of the printing plate extends around the imaging drum in a substantially circumferential direction;
   b) an illumination source operable for illuminating a region associated with each of at least one point on the reference edge, each region comprising at least a part of the reference edge,
   c) a digital camera operable for capturing a digital camera image of each region, and
   d) one or more processors operable for:
      i) determining a location of each point by at least locating the at least a part of the reference edge in each digital camera image and,
      ii) adjusting print image data representing the print image in accordance with the determined locations of each point, the adjusted print image data comprising data to align the print image with at least the determined location of each point; and,
   e) an imaging head operable for receiving the adjusted print image data from the one or more processors and for imparting the print image onto the printing plate in accordance with the adjusted print image data.

30. An apparatus as in claim 29, wherein the at least one point comprises at least two circumferentially spaced apart points on the reference edge, and wherein:
   a) the one or more processors are further operable for:
      i) transforming the print image data into transformed print image data based on the determined locations of each of the at least two circumferentially spaced apart points, the transformed print image data comprising data to align the print image with the reference edge, and
   b) the image head is further operable for:
      i) imparting the print image on the printing plate in accordance with the transformed print image data, the imparted print image being aligned with the reference edge.

31. An apparatus as in claim 30, comprising a movable carriage operable for moving the imaging head in an axial direction relative to the imaging drum, the carriage being further operable for moving at least one of digital camera and the illumination source in the axial direction.

32. An apparatus as in claim 29, wherein the imaging drum is operable for rotating during at least one of:
   a) the illuminating of each of the regions, and
   b) the capturing of a digital camera image each of the regions.

33. An apparatus as in claim 30, wherein the digital camera comprises one of:
   a) a CCD sensor, and
   b) a CMOS sensor.

34. An apparatus as in claim 30, wherein the illumination source comprises a LED.

35. An apparatus as in claim 30, further comprising a controller operable for flashing the illumination source during the illumination of each region associated with each of the at the at least two circumferentially spaced apart points.

* * * * *